(12) United States Patent
Steffens et al.

(10) Patent No.: US 11,894,882 B2
(45) Date of Patent: Feb. 6, 2024

(54) MEASUREMENT SYSTEM AND MEASUREMENT METHOD

(71) Applicant: Rohde & Schwarz GmbH & Co. KG, Munich (DE)

(72) Inventors: Johannes Steffens, Munich (DE); Torsten Schorr, Munich (DE); Luke Cirillo, Munich (DE); Florian Ramian, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 287 days.

(21) Appl. No.: 17/372,049

(22) Filed: Jul. 9, 2021

(65) Prior Publication Data
US 2022/0045774 A1      Feb. 10, 2022

(30) Foreign Application Priority Data
Aug. 7, 2020  (EP) ..................................... 20190129

(51) Int. Cl.
*H04B 17/391*          (2015.01)
(52) U.S. Cl.
CPC .................................. *H04B 17/391* (2015.01)
(58) Field of Classification Search
CPC ..................................................... H04B 17/391
See application file for complete search history.

(56) References Cited

U.S. PATENT DOCUMENTS 5,583,430 A * 12/1996 Dinteman ........ G01R 31/31922
                                                    324/73.1
7,919,969 B2 * 4/2011 Held ...................... G01R 27/32
                                                    324/76.23
(Continued)

FOREIGN PATENT DOCUMENTS

CN      109709474 A       5/2019
EP         1181562         2/2002
(Continued)

OTHER PUBLICATIONS

Cruz, P. et al., "Mixed Analog-Digital Instrumentation for Software-Defined-Radio Characterization," Microwave Symposium Digest, IEEE, New Jersey, USA, 2008, pp. 253-256.

*Primary Examiner* — Natasha W Cosme
(74) *Attorney, Agent, or Firm* — CHRISTENSEN O'CONNOR JOHNSON KINDNESS PLLC (57) ABSTRACT

A measurement system for characterizing a device under test is described. The measurement system includes a signal source, an analysis module, and a directional element that is connected to each of the device under test, the signal source, and the analysis module. The signal source is configured to generate a digital instruction signal or an analog stimulus signal for the device under test. In the case of generating the analog stimulus signal, the directional element is configured to forward the analog stimulus signal from the signal source to the device under test, wherein the device under test includes circuitry configured to generate a digital output signal based on the analog stimulus signal received. In the case of generating the digital instruction signal by the signal source, the device under test includes circuitry configured to generate an analog output signal based on the digital instruction signal received, wherein the directional element is configured to forward the analog output signal generated to the analysis module. The analysis module includes circuitry configured to determine at least one characteristic parameter of the device under test based on the analog output signal of the device under test or the digital output signal of the device under test. Moreover, a measurement method for characterizing a device under test is described.

17 Claims, 2 Drawing Sheets

(56) References Cited

U.S. PATENT DOCUMENTS

| | | | |
|---|---|---|---|
| 2002/0080448 A1* | 6/2002 | Kim | H04B 10/25753 |
| | | | 398/115 |
| 2006/0066289 A1 | 3/2006 | Tambakuchi | |
| 2006/0258293 A1 | 11/2006 | Steffen et al. | |
| 2008/0265868 A1 | 10/2008 | Prather | |
| 2011/0060933 A1 | 3/2011 | Iwamoto | |
| 2011/0119000 A1 | 5/2011 | Suskic | |
| 2019/0056441 A1* | 2/2019 | Heuel | G01R 27/28 |

FOREIGN PATENT DOCUMENTS

| | | |
|---|---|---|
| EP | 3444622 A1 | 2/2019 |
| WO | 00/46605 A2 | 8/2000 |
| WO | 2009/079042 A1 | 6/2009 |
| WO | 2014/139048 A1 | 9/2014 |
| WO | 2019/037847 A1 | 2/2019 |

* cited by examiner

Fig. 1

MEASUREMENT SYSTEM AND MEASUREMENT METHOD

FIELD OF THE DISCLOSURE

Embodiments of the present disclosure generally relate to a measurement system for characterizing a device under test. Embodiments of the present disclosure further relate to a measurement method for characterizing a device under test.

BACKGROUND

An increasing amount of electronic devices comprise so-called integrated frontends. These integrated frontends contain a digital part (e.g. a chipset) for signal generation or signal processing, an analog-to-digital converter or a digital-to-analog converter, optionally an RF mixer and often also an RF amplifier or a low-noise amplifier in order to amplify the TX or RX signal.

Such electronic devices cannot be tested in the same way as traditional two-port devices, which may, e.g., be tested via a conventional vector network analyzer.

However, it is still important to be able to characterize certain performance parameters of analog-to-digital devices or of digital-to-analog devices in order to ensure a correct functionality of the respective electronic device.

Accordingly, there is a need for a measurement system as well as for a measurement method that allow for a characterization of the performance of analog-to-digital devices or of digital-to-analog devices.

SUMMARY

Embodiments of the present disclosure provide a measurement system for characterizing a device under test. In an embodiment, the measurement system comprises a signal source, an analysis module comprising, for example, one or more circuits, and a directional element that is connected to each of the device under test, the signal source, and the analysis module. The device under test is established, for example, as an RF-to-digital device comprising an analog input, or as a digital-to-RF device comprising a digital input. The signal source is configured to generate a digital instruction signal or an analog stimulus signal for the device under test.

In the case of generating the analog stimulus signal by the signal source, the directional element is configured to forward the analog stimulus signal from the signal source to the device under test, wherein the device under test is configured to generate a digital output signal based on the analog stimulus signal received, and wherein the digital output signal is forwarded to the analysis module.

In the case of generating the digital instruction signal by the signal source, the device under test is configured to generate an analog output signal based on the digital instruction signal received, wherein the directional element is configured to forward the analog output signal generated to the analysis module. The analysis module, for example the one or more circuits, is configured to determine at least one characteristic parameter of the device under test based on the analog output signal of the device under test or the digital output signal of the device under test.

With the measurement system according to the present disclosure, the performance of the device under test can be tested by determining the at least one characteristic parameter irrespective of whether the device under test is established as an analog-to-digital device or as a digital-to-analog device.

If the signal source generates the digital instruction signal for the device under test, then the device under test generates the analog output signal, which is forwarded to the analysis module via the directional element. The analysis module then analyzes the analog output signal in order to determine the at least one characteristic parameter.

Therein, the signal source may be connected directly to a digital input of the device under test. However, the instruction signal may, in principle, also be forwarded to the device under test via the directional element.

If the signal source generates the analog stimulus signal for the device under test, the device under test generates the digital output signal. The digital output signal may be forwarded to the analysis module directly. In other words, the analysis module may be connected directly with a digital output of the device under test. However, the digital output signal may, in principle, also be forwarded to the analysis module via the directional element.

In general, the digital instruction signal and the digital output signal may each be established as a digital signal comprising a symbol sequence, for example a bit sequence.

In some embodiments, the digital instruction signal and the digital output signal may relate to a digital data file.

Generally, the digital input may be configured as a digital streaming interface that is configured to receive the digital signal, for example the digital instruction signal. Alternatively or additionally, the digital input may be established as another type of digital interface for data transfer, e.g. as a USB interface, as a LAN interface, etc.

According to an aspect of the present disclosure, the directional element is configured to forward a reflected signal to the analysis module, wherein the reflected signal is reflected at the analog input of the device under test. Accordingly, the analysis module may receive and analyze the reflected signal, for example for S-parameter measurements. In other words, the measurement system may be configured to determine both at least one characteristic parameter being associated with transmission properties of the device under test (similar to an S12-parameter measurement with conventional vector network analyzers) and at least one characteristic parameter being associated with reflection properties of the device under test.

The reflected signal may be forwarded to and analyzed by the analysis module when the device under test is transmitting the analog output signal, which may also be called "hot S-parameter measurement". Alternatively, the reflected signal may be forwarded to and analyzed by the analysis module when the device under test is not transmitting the analog output signal, which may also be called "cold S-parameter measurement".

According to another aspect of the present disclosure, the analysis module includes one or more circuits configured to determine the at least one characteristic parameter based on the reflected signal. In some embodiments, the analysis module may be configured to determine an S-parameter, for example an S11-parameter of the device under test based on the reflected signal, i.e., the S-parameter being associated with reflections at the analog input of the device under test.

In some embodiments, the at least one characteristic parameter comprises at least one of an error vector magnitude, an amplitude response of the device under test, a phase response of the device under test, a frequency response of the device under test, a non-linearity of the device under test, an S-parameter of the device under test, or a group delay of the device under test. For example, the at least one characteristic parameter comprises an S11-parameter.

In other words, the analysis module may determine one or several characteristic parameters that are associated with transmission properties of the device under test, i.e., the amplitude response of the device under test, the phase response of the device under test, the frequency response of the device under test, the non-linearity of the device under test, and/or the group delay of the device under test.

Alternatively or additionally, the analysis module may determine one or several characteristic parameters that are associated with a quality of the output signal generated by the device under test, for example with a quality of a modulation of the output signal, e.g., the error vector magnitude.

In a further embodiment of the present disclosure, the device under test has a receiving mode and/or a transmitting mode.

In the receiving mode, the device under test may receive and process the analog stimulus signal internally. Accordingly, the device under test may generate a digital set of processed data based on the analog stimulus signal. The digital set of processed data may then be forwarded to the analysis module, and the analysis module may determine the at least one characteristic parameter based on the digital set of processed data. In other words, the "digital output signal" of the device under test may be the digital set of processed data.

Alternatively or additionally, the device under test may receive and process a digital signal via the digital input in the receiving mode. In some embodiments, the device under test receives and processes the digital instruction signal, for instance a digital data file. The device under test may store the received digital signal in the receiving mode.

In the transmitting mode, the device under test receives the digital instruction signal or the analog stimulus signal, wherein the device under test generates the analog output signal or the digital output signal, respectively. In this case, the analog output signal or the digital output signal is transmitted by the device under test.

According to another aspect of the present disclosure, the signal source is configured to generate an analog test signal if the device under test is in the transmitting mode, wherein the directional element is configured to forward the analog test signal to the analog input of the device under test, and wherein the directional element is configured to forward a reflected portion of the analog test signal reflected at the analog input to the analysis module. Accordingly, two different signals are forwarded to the analysis module, namely the analog output signal generated by the device under test based on the digital instruction signal, and the reflected portion of the analog test signal. By analyzing both signals, both the digital-to-analog transmission properties of the device under test and the S11-parameter of the analog input of the device under test can be measured at the same time. In other words, the measurement system is configured for so-called hot S-parameter measurements on a digital-to-RF device under test, i.e., measurements of an S-parameter (the S11-parameter) while the device under test is transmitting the analog output signal.

In a further embodiment of the present disclosure, the analog test signal is separable from the analog output signal of the device under test, for example wherein the analog test signal is orthogonal to the analog output signal, thereby ensuring the separability of the analog test signal and the analog output signal. In other words, the analog test signal is distinguishably different from the analog output signal of the device under test, such that the analysis module can identify the individual contributions from the analog test signal and from the analog output signal even if the analog test signal and the analog output signal are superposed.

In some embodiments, the analog test signal has a frequency or frequency range that is distinguishably different from the frequency or frequency range of the analog output signal of the device under test.

Accordingly, the analysis module may determine both the digital-to-analog transmission properties of the device under test and the S11-parameter of the analog input of the device under test simultaneously, without the two different measurements interfering with one another.

According to an aspect of the present disclosure, the analysis module is established as a vector signal analyzer. Alternatively, the analysis module may be established as an oscilloscope, or as a computer with a suitable measurement application.

According to another aspect of the present disclosure, the signal source is established as a vector signal generator. The vector signal generator is configured to generate the analog stimulus signal with arbitrary predefined properties, for example with a predefined modulation and frequency content.

Additionally, the vector signal generator may be configured to generate the digital instruction signal and to forward the digital instruction signal to the device under test.

In a further embodiment of the present disclosure, the directional element is established as a directional coupler. For example, the directional coupler is configured such that analog signals coming from the signal source are forwarded only to the device under test, while analog signals coming from the device under test are forwarded only to the analysis module.

According to another aspect of the present disclosure, the analog output signal or the analog stimulus signal comprises a marker. The marker may indicate the start of the transmission of the analog output signal or the start of the transmission of the analog stimulus signal.

Alternatively or additionally, the marker may be established as a predefined waveform in the analog output signal or in the analog stimulus signal serving as a trigger event for a trigger of the analysis module. Thus, the analysis module may use the marker in order to synchronize itself with the signal source and/or with the device under test.

In a further embodiment of the present disclosure, the signal source and/or the device under test are/is configured to generate a reference signal and to forward the reference signal to the analysis module. The reference signal may be used for synchronizing the signal source with the analysis module and/or for synchronizing the device under test with the analysis module.

The measurement system may further comprise a control module, wherein the control module includes one or more circuits configured to control the signal source, the analysis module, and/or the device under test. In some embodiments, the control module may control the device under test, the signal source and/or the analysis module to enter a certain operational mode.

For example, the control module is configured to perform a predetermined test routine for determining the characteristic parameters of the device under test, wherein different measurements may be performed sequentially.

The control module may be established separately from the analysis module. Alternatively, the analysis module may comprise the control module or vice versa.

According to another aspect of the present disclosure, the analog stimulus signal is established as a wideband modulated signal, or the digital instruction signal is established as a digital IQ signal. Accordingly, the signal source may be configured to generate a wideband modulated signal. Accordingly, the device under test may receive and demodulate the wideband modulated signal in order to generate the digital output signal. The digital output signal may be established as IQ data being associated with the wideband modulated signal.

Conversely, the digital IQ signal may comprise all information on the analog output signal that is to be generated by the device under test, for example information on a modulation and a frequency content of the analog output signal to be generated.

Embodiments of the present disclosure further provide a measurement method for characterizing a device under test, wherein the device under test is established as an RF-to-digital device comprising an analog input, or wherein the device under test is established as a digital-to-RF device comprising a digital input. In an embodiment, the measurement method comprises the following steps:

generating a digital instruction signal or an analog stimulus signal for the device under test by a signal source;

in the case of generating the analog stimulus signal by the signal source, forwarding the analog stimulus signal to the device under test by a directional element, generating a digital output signal based on the analog stimulus signal by the device under test, and forwarding the digital output signal to an analysis module;

in the case of generating the digital instruction signal by the signal source, forwarding the digital instruction signal to the device under test, generating an analog output signal based on the digital instruction signal by the device under test, and forwarding the analog output signal to the analysis module via the directional element; and determining at least one characteristic parameter of the device under test based on the analog output signal of the device under test or the digital output signal of the device under test by the analysis module (e.g., via suitably configured circuitry of analysis module).

In some embodiments, the measurement system described above is configured to perform the measurement method for characterizing a device under test.

Regarding the advantages and further properties of the measurement method, reference is made to the explanations given above with respect to the measurement system, which also hold for the measurement method and vice versa.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth above in connection with the appended drawings, where like numerals reference like elements, are intended as a description of various embodiments of the present disclosure and are not intended to represent the only embodiments. Each embodiment described in this disclosure is provided merely as an example or illustration and should not be construed as preferred or advantageous over other embodiments. The illustrative examples provided herein are not intended to be exhaustive or to limit the disclosure to the precise forms disclosed. Similarly, any steps described herein may be interchangeable with other steps, or combinations of steps, in order to achieve the same or substantially similar result. Moreover, some of the method steps can be carried serially or in parallel, or in any order unless specifically expressed or understood in the context of other method steps.

In the foregoing description, specific details are set forth to provide a thorough understanding of exemplary embodiments of the present disclosure. It will be apparent to one skilled in the art, however, that the embodiments disclosed herein may be practiced without embodying all of the specific details. In some instances, well-known process steps have not been described in detail in order not to unnecessarily obscure various aspects of the present disclosure. Further, it will be appreciated that embodiments of the present disclosure may employ any combination of features described herein.

Throughout this specification, terms of art may be used. These terms are to take on their ordinary meaning in the art from which they come, unless specifically defined herein or the context of their use would clearly suggest otherwise.

Figure 1:
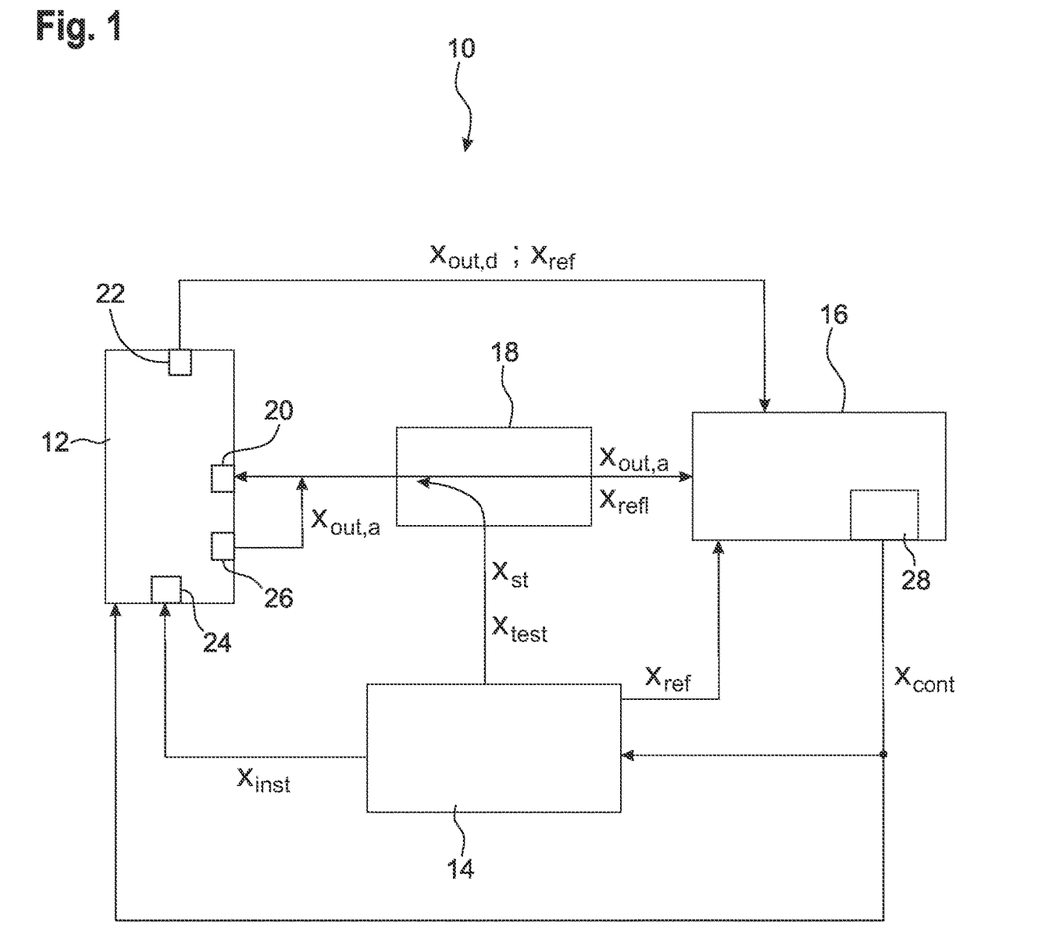
FIG. 1 schematically shows a block diagram of a measurement system according to an embodiment of the present disclosure.

FIG. 1 schematically shows a measurement system 10 comprising a device under test 12, a signal source 14, an analysis module 16, and a directional element 18.

In some embodiments, the term "module" refers to or includes, inter alia, a combination of hardware (e.g. a processor such as an integrated circuit, digital circuits or other circuitry) and software (e.g. machine- or processor-executable instructions, commands, or code such as firmware, programming, or object code). Furthermore, a combination of hardware and software may include hardware only (i.e. a hardware element with no software elements), software hosted at hardware (e.g. software that is stored at a memory and executed or interpreted at a processor), or hardware with the software hosted thereon. In some embodiments, the hardware may, inter alia, comprise a CPU, a GPU, an FPGA, an ASIC, or other types of electronic circuitry.

The device under test 12 is established as an RF-to-digital device comprising at least one analog input 20 and at least one digital output 22, and/or as a digital-to-RF device comprising at least one digital input 24 and at least one analog output 26. Accordingly, the device under test 12 may be configured to receive an analog signal via the analog input 20, and to generate a digital output signal $x_{out,d}$ based on the received analog signal. Alternatively or additionally, the device under test 12 may be configured to receive a digital input signal via the digital input 24, and to generate an analog output signal $x_{out,a}$ based on the received digital signal.

The digital input 24 and/or the digital output 22 may each be configured as a digital streaming interface that is configured to receive a digital signal or transmit a digital signal, respectively. Alternatively or additionally, the digital input 24 and/or the digital output 22 may each be established as another type of digital interface for data transfer, e.g. as a USB interface, as a LAN interface, etc.

In general, the signal source 14 is configured to generate an analog stimulus signal $x_{st}$ for the device under test 12 and/or a digital instruction signal $x_{inst}$ for the device under test 12. For example, the signal source 14 may be established as a vector signal generator.

In embodiments of the disclosure, the analysis module 16 includes, inter alia, circuitry configured to analyze the analog output signal $x_{out,a}$ of the device under test 12 and/or the digital output signal $x_{out,d}$ of the device under test 12. For example, the analysis module 16 is established as a vector signal analyzer. Alternatively, the analysis module 16 may be established as an oscilloscope or as a computer with a suitable measurement application.

In some embodiments, the analysis module 16 may comprise a control module 28 comprising circuitry configured to control the signal source 14 and/or the device under test 12 via a corresponding control signal $x_{cont}$ that is generated by the control module 28. The control signal $x_{cont}$ may be forwarded to the signal source 14 and/or to the device under test 12 via LAN or via another suitable type of connection. In some embodiments, the control module 28 may also be configured to control the analysis module 16.

Alternatively, the control module 28 may be established separately from the analysis module 16, and may be configured to also control the analysis module 16. For example, the control module 28 is established as a computer with a suitable software application.

The directional element 18 is connected to each of the signal source 14, the analysis module 16, and at least to the analog input 20 of the device under test 12. In some embodiments, the directional element is also connected to the analog output 26 of the device under test 12.

In general, the directional element 18 is configured to forward any analog signal coming from the signal source 14 to the device under test 12, more precisely to the analog input 20 of the device under test 12. Moreover, the directional element 18 is configured to forward any analog signal coming from the device under test 12, for example coming from the analog output 26 of the device under test 12 or from the analog input 20 of the device under test 12 to the analysis module 16. In some embodiments, the directional element 18 may be established as a directional coupler.

In general, the measurement system 10 is configured to characterize the device under test 12 with respect to transmission properties and reflection properties, and with respect to a quality of the output signal ($x_{out,a}$ and/or $x_{out,d}$) generated by the device under test 12. For example, the measurement system 10 is configured to perform a representative measurement method which is described in the following with reference to the embodiment of FIG. 2.

Figure 2:
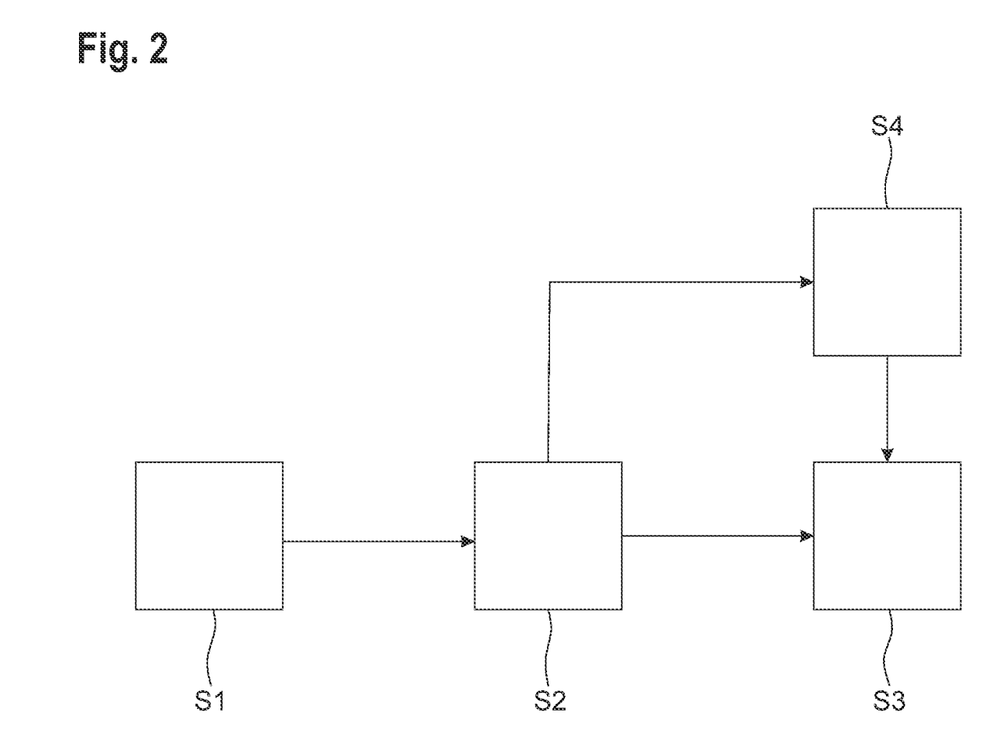
FIG. 2 shows a flow chart of a measurement method according to an embodiment of the present disclosure.

An analog stimulus signal $x_{st}$ and/or a digital instruction signal $x_{inst}$ is generated by the signal source 14 (step S1). If the digital instruction signal $x_{inst}$ is generated, it is forwarded directly to the digital input 24 of the device under test 12.

The digital instruction signal $x_{inst}$ may be established as an IQ data signal comprising information on the analog output signal $x_{out,a}$ that is to be generated with predefined properties by the device under test 12. In some embodiments, the digital instruction signal $x_{inst}$ may comprise information on a modulation and a frequency content of the analog output signal $x_{out,a}$ that is to be generated. In principle, the digital instruction signal $x_{inst}$ may also be forwarded to the device under test 12 via the directional element 18.

If the analog stimulus signal $x_{st}$ is generated, it is forwarded to the device under test 12 or rather to the analog input 20 of the device under test 12 via the directional element 18. The analog stimulus $x_{st}$ signal may be established as a wideband modulated signal having a predefined modulation and a predefined frequency content.

In either case, the device under test 12 generates an output signal based on the signal received from the signal source 14 (step S2).

If the digital instruction signal is received, then the device under test 12 generates the analog output signal $x_{out,a}$ and transmits the analog output signal $x_{out,a}$ via the analog output 26. The analog output signal $x_{out,a}$ is then forwarded to the analysis module 16 via the directional element 18.

If the analog stimulus signal $x_{st}$ is received, then the device under test 12 may generate a digital output signal $x_{out,a}$ that is transmitted via the digital output 22 and may be forwarded directly to the analysis module 16. In other words, the device under test 12 may be in a transmitting mode.

It is noted that the digital output signal could, in principle, be forwarded to the analysis module 16 via the directional element 18.

Alternatively, the device under test 12 may be in a receiving mode. In the receiving mode, the device under test 12 receives the analog stimulus signal $x_{st}$ and processes, via one or more circuits, the analog stimulus signal $x_{st}$ internally. Accordingly, the device under test 12 may generate a digital set of processed data based on the analog stimulus signal $x_{st}$.

The digital set of processed data may then be forwarded to the analysis module 16 or read out by the analysis module 16 via the digital output 22. In other words, in this case the digital output signal $x_{out,a}$ of the device under test 12 may be the digital set of processed data described above.

Alternatively or additionally, the device under test 12 may receive and process a digital signal via the digital input in the receiving mode. In some embodiments, the device under test 12 receives and processes the digital instruction signal. For example, the device under test 12 may store the received digital signal in the receiving mode.

At least one characteristic parameter of the device under test 12 is determined based on the analog output signal $x_{out,a}$ and/or based on the digital output signal $x_{out,a}$ (step S3).

The at least one characteristic parameter comprises at least one of, for example several or all of an error vector magnitude, an amplitude response of the device under test 12, a phase response of the device under test 12, a frequency response of the device under test 12, a non-linearity of the device under test 12, an S-parameter of the device under test 12, and/or a group delay of the device under test 12.

In order to determine some of these quantities, a reference signal may be necessary. For example, in order to determine the amplitude response, the phase response, the frequency response, the non-linearity, or the S-parameters of the device under test 12, an output signal of the device under test 12 needs to be compared with the corresponding input signal. Accordingly, the signal source 14 and/or the device under test 12 may be configured to forward a corresponding reference signal $x_{ref}$ to the analysis module 16.

Alternatively or additionally, the analog stimulus signal $x_{st}$ and/or the analog output signal $x_{out,a}$ may comprise a marker. The marker may indicate the start of the transmission of the analog output signal $x_{out,a}$ or the start of the transmission of the analog stimulus signal $x_{st}$.

Alternatively or additionally, the marker may be established as a predefined waveform in the analog output signal $x_{out,a}$ or in the analog stimulus signal $x_{st}$. For example, the predefined waveform may serve as a trigger event for a trigger of the analysis module 16. Thus, the analysis module 16 may use the marker in order to synchronize itself with the signal source 14 and/or with the device under test 12.

Alternatively or additionally, the analysis module 16 may use the marker to synchronize the digital output signal $x_{out,a}$ with the reference signal $x_{ref}$.

If the signal source 14 generates the analog stimulus signal $x_{st}$, reflections may occur at the analog input of the device under test 12. The corresponding reflected signal $x_{refl}$ may be forwarded to the analysis module 16 via the directional element 18 and may be analyzed in order to determine the at least one characteristic parameter (step S4).

In some embodiments, an S11-parameter of the device under test 12 or rather of the analog input 20 can be determined based on the reflected portion of the analog stimulus signal $x_{st}$. In some embodiments, the S11-parameter may be determined via a so-called hot S-parameter measurement.

When the device under test 12 is generating the analog output signal $x_{out,a}$ based on the digital instruction signal $x_{inst}$, the signal source 14 may generate an analog test signal $x_{test}$ that is forwarded to the analog input 20 via the directional element 18. A portion of the test signal $x_{test}$ is reflected at the analog input 20, wherein the reflected portion is forwarded to the signal source 14.

Therein, the test signal $x_{test}$ is generated with predefined properties, such that the test signal $x_{test}$ is separable from the analog output signal $x_{out,a}$ of the device under test 12. In other words, the test signal $x_{test}$ is generated such that the analysis module 16 can clearly distinguish between the test signal $x_{test}$ and the analog output signal $x_{out,a}$. For example, the analog test signal $x_{test}$ has a frequency or frequency range that is distinguishably different from the analog output signal of the device under test 12.

In some embodiments, the analog test signal $x_{test}$ is orthogonal to the analog output signal $x_{out,a}$. For example, one or several carriers of the analog test signal $x_{test}$ having certain carrier frequencies may be orthogonal to the corresponding carrier(s) of the analog output signal $x_{out,a}$.

Thus, the analysis module 16 can clearly distinguish between the analog test signal $x_{test}$ and the analog output signal $x_{out,a}$, and can determine the S11-parameter and the other characteristic parameters of the device under test 12 simultaneously, even if the analog test signal $x_{test}$ and the analog output signal $x_{out,a}$ are superposed.

Summarizing, the measurement system 10 and the measurement method described above provide the possibility to test the performance of the device under test 12 by determining the at least one characteristic parameter, irrespective of whether the device under test 12 is established as an analog-to-digital (or rather RF-to-digital) device or as a digital-to-analog (or rather digital-to-RF) device.

Certain embodiments disclosed herein, for example the respective module(s), utilize circuitry (e.g., one or more circuits) in order to implement standards, protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes one or more processors or portions thereof and accompanying software, firmware, hardware, and the like.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A measurement system for characterizing a device under test, comprising:
   a signal source, an analysis module, and a directional element that is connected to each of the device under test, the signal source, and the analysis module,
   wherein the device under test is established as an RF-to-digital device comprising an analog input, or wherein the device under test is established as a digital-to-RF device comprising a digital input;
   wherein the signal source is configured to generate a digital instruction signal or an analog stimulus signal for the device under test;
   wherein, in the case of generating the analog stimulus signal by the signal source, the directional element is configured to forward the analog stimulus signal from the signal source to the device under test, wherein the device under test is configured to generate a digital output signal based on the analog stimulus signal received, wherein the digital output signal is forwarded to the analysis module;

wherein, in the case of generating the digital instruction signal by the signal source, the device under test is configured to generate an analog output signal based on the digital instruction signal received, wherein the directional element is configured to forward the analog output signal generated to the analysis module;

wherein the analysis module includes circuitry configured to determine at least one characteristic parameter of the device under test based on the analog output signal of the device under test or the digital output signal of the device under test;

wherein the device under test has a transmitting mode; and wherein the signal source is configured to generate an analog test signal if the device under test is in the transmitting mode, wherein the directional element is configured to forward the analog test signal to the analog input of the device under test, and wherein the directional element is configured to forward a reflected portion of the analog test signal reflected at the analog input to the analysis module.

2. The measurement system of claim 1, wherein the directional element is configured to forward a reflected signal to the analysis module, wherein the reflected signal is reflected at the analog input of the device under test.

3. The measurement system of claim 2, wherein the analysis module includes circuitry configured to determine the at least one characteristic parameter based on the reflected signal.

4. The measurement system according to claim 1, wherein the at least one characteristic parameter comprises at least one of an error vector magnitude, an amplitude response of the device under test, a phase response of the device under test, a frequency response of the device under test, a non-linearity of the device under test, an S-parameter of the device under test, or a group delay of the device under test.

5. The measurement system according to claim 1, wherein the device under test has a receiving mode.

6. The measurement system according to claim 1, wherein the analog test signal is separable from the analog output signal of the device under test.

7. The measurement system of claim 6, wherein the analog test signal is orthogonal to the analog output signal, thereby ensuring the separability of the analog test signal and the analog output signal.

8. The measurement system according to claim 1, wherein the analysis module is established as a vector signal analyzer.

9. The measurement system according to claim 1, wherein the signal source is established as a vector signal generator.

10. The measurement system according to claim 1, wherein the directional element is established as a directional coupler.

11. The measurement system according to claim 1, wherein the analog output signal or the analog stimulus signal comprises a marker.

12. The measurement system according to claim 1, wherein at least one of the signal source or the device under test is configured to generate a reference signal and to forward the reference signal to the analysis module.

13. The measurement system according to claim 1, further comprising a control module including circuitry configured to control at least one of the signal source, the analysis module, and the device under test.

14. The measurement system according to claim 1, wherein the analog stimulus signal is established as a wideband modulated signal.

15. The measurement system according to claim 1, wherein the digital instruction signal is established as a digital IQ signal.

16. A measurement method for characterizing a device under test, wherein the device under test is established as an RF-to-digital device comprising an analog input, or wherein the device under test is established as a digital-to-RF device comprising a digital input, comprising:

generating a digital instruction signal or an analog stimulus signal for the device under test by a signal source;

in the case of generating the analog stimulus signal by the signal source, forwarding the analog stimulus signal to the device under test by a directional element, generating a digital output signal based on the analog stimulus signal by the device under test, and forwarding the digital output signal to an analysis module;

in the case of generating the digital instruction signal by the signal source, forwarding the digital instruction signal to the device under test, generating an analog output signal based on the digital instruction signal by the device under test, and forwarding the analog output signal to the analysis module via the directional element; and determining, by the analysis module, at least one characteristic parameter of the device under test based on the analog output signal of the device under test or the digital output signal of the device under test.

17. A measurement system for characterizing a device under test, comprising:

a signal source, an analysis module, and a directional element that is connected to each of the device under test, the signal source, and the analysis module, wherein the device under test is established as an RF-to-digital device comprising an analog input, or wherein the device under test is established as a digital-to-RF device comprising a digital input;

wherein the signal source is configured to generate a digital instruction signal or an analog stimulus signal for the device under test;

wherein, in the case of generating the analog stimulus signal by the signal source, the directional element is configured to forward the analog stimulus signal from the signal source to the device under test, wherein the device under test is configured to generate a digital output signal based on the analog stimulus signal received, wherein the digital output signal is forwarded to the analysis module;

wherein, in the case of generating the digital instruction signal by the signal source, the device under test is configured to generate an analog output signal based on the digital instruction signal received, wherein the directional element is configured to forward the analog output signal generated to the analysis module;

wherein the analysis module includes circuitry configured to determine at least one characteristic parameter of the device under test based on the analog output signal of the device under test or the digital output signal of the device under test;

wherein the device under test has a transmitting mode;

wherein the signal source is configured to generate an analog test signal if the device under test is in the transmitting mode, wherein the directional element is configured to forward the analog test signal to the analog input of the device under test;

wherein the analog test signal is separable from the analog output signal of the device under test; and wherein the analog test signal is orthogonal to the analog output signal, thereby ensuring the separability of the analog test signal and the analog output signal.

\* \* \* \* \*